(12) United States Patent
Schmitt et al.

(10) Patent No.: US 11,277,946 B2
(45) Date of Patent: Mar. 15, 2022

(54) HOUSING FOR AN INVERTER HAVING A COOLING SYSTEM FOR AN ELECTRIC DRIVE

(71) Applicant: Valeo Siemens eAutomotive Germany GmbH, Erlangen (DE)

(72) Inventors: Matthias Schmitt, Schwabach (DE); Alexandros Kourgialis, Fürth (DE); Anna Kaiser, Nuremberg (DE); Andrei Alexandru, Fürth (DE); Christoph Hoyler, Kirchensittenbach (DE); Michael Nobel, Nuremberg (DE)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 0 days.

(21) Appl. No.: 17/054,948

(22) PCT Filed: May 14, 2019

(86) PCT No.: PCT/EP2019/062334
§ 371 (c)(1),
(2) Date: Nov. 12, 2020

(87) PCT Pub. No.: WO2019/219675
PCT Pub. Date: Nov. 21, 2019

(65) Prior Publication Data
US 2021/0259142 A1    Aug. 19, 2021

(30) Foreign Application Priority Data
May 15, 2018  (DE) .................... 10 2018 111 619.5

(51) Int. Cl.
*G06F 1/16* (2006.01)
*H05K 5/00* (2006.01)
(Continued)

(52) U.S. Cl.
CPC ..... *H05K 7/20936* (2013.01); *H05K 7/20318* (2013.01); *H05K 7/20327* (2013.01)

(58) Field of Classification Search
CPC ........... H05K 7/20936; H05K 7/20318; H05K 7/20327; H05K 7/20927; H05K 7/20945;
(Continued)

(56) References Cited

U.S. PATENT DOCUMENTS 5,497,289 A * 3/1996 Sugishima ............ H02M 7/003
                                                                318/558
7,095,612 B2    8/2006 Beihoff et al.
(Continued)

FOREIGN PATENT DOCUMENTS

DE         60313430 T2     1/2008
DE     102010025656 A1    1/2012
(Continued)

OTHER PUBLICATIONS

PCT/ISA/210, "International Search Report for International Application No. PCT/EP2019/062334," dated Aug. 29, 2019.
(Continued)

*Primary Examiner* — Anthony M Haughton
(74) *Attorney, Agent, or Firm* — Manabu Kanesaka

(57) ABSTRACT

A housing for an inverter includes circuit elements and a cooling system, wherein the housing has four openings and the cooling system includes two channels arranged in the housing, each of which is connected to two different openings, and a condenser is arranged below the housing, wherein two openings from different channels are connected for communication by means of a connecting element arranged outside the housing and the connecting element is of rigid design and extends past the side of the condenser.

10 Claims, 10 Drawing Sheets

(51) Int. Cl.
*H05K 7/00* (2006.01)
*H05K 7/20* (2006.01)

(58) Field of Classification Search
CPC ............ H05K 7/2089; H05K 7/20336; H05K 7/20309
See application file for complete search history.

(56) References Cited

U.S. PATENT DOCUMENTS

| | | | |
|---|---|---|---|
| 7,106,414 B2 * | 9/2006 | Tsuji | G03F 7/709 355/30 |
| 7,830,689 B2 | 11/2010 | Nakamura et al. | |
| 7,952,876 B2 | 5/2011 | Azuma et al. | |
| 8,829,669 B2 * | 9/2014 | Hotta | H05K 7/20927 257/712 |
| 9,648,791 B2 | 5/2017 | Tokuyama et al. | |
| 9,703,213 B2 * | 7/2017 | Peijster | B82Y 40/00 |
| 11,088,649 B2 * | 8/2021 | Kitamura | B60L 50/51 |
| 2002/0027645 A1 * | 3/2002 | Shiraishi | G03F 7/70833 355/30 |
| 2009/0021971 A1 | 1/2009 | Korich et al. | |
| 2015/0152987 A1 | 6/2015 | Ishikawa | |

FOREIGN PATENT DOCUMENTS

| | | |
|---|---|---|
| EP | 1919069 A2 | 5/2008 |
| EP | 3188352 A1 | 7/2017 |
| EP | 3300239 A1 | 3/2018 |
| JP | 2008-295139 A | 12/2008 |
| JP | 2014-103733 A | 6/2014 |

OTHER PUBLICATIONS

PCT/ISA/237, "Written Opinion of the International Searching Authority for International Application No. PCT/EP2019/062334," dated Aug. 29, 2019.

* cited by examiner

HOUSING FOR AN INVERTER HAVING A COOLING SYSTEM FOR AN ELECTRIC DRIVE

RELATED APPLICATIONS

The present application is National Phase of International Application No. PCT/EP2019/062334 filed May 14, 2019, and claims priority from German Application No. 10 2018 111 619.5, filed May 15, 2018, the disclosure of which is hereby incorporated by reference herein in its entirety.

The invention relates to a housing for an inverter having a cooling system for an electric drive.

PRIOR ART

Electric drives are known in general and are being used increasingly to power vehicles.

An inverter is required to power an AC motor from batteries; such an inverter is shown, for example, in EP 3 188 352.

EP 3 188 352 A1 discloses a housing comprising a cooling channel for the inverter. The cooling liquid enters the housing through an opening and flows around the circuit elements and then leaves the housing through another opening.

EP 3 300 239 A shows a housing for an inverter comprising two openings for the cooling liquid. The liquid enters the housing, flows around the circuit elements, and then leaves the housing.

US 2009021971 A1 shows a U-shaped plate cooler, which is cooled by means of a cooling liquid passing through it.

PROBLEM AND SOLUTION

The problem addressed by the present invention is to improve a cooling system for an inverter of an electric drive in such a way that the design is as compact as possible, but at the same time sufficient cooling is achieved.

The object is achieved by a housing having a cooling system according to the independent claim. Further advantageous embodiments of the invention are the subject of the dependent claims.

In accordance with the invention, a housing for an inverter comprises circuit elements and a cooling system, wherein the housing has four openings and the cooling system comprises two channels arranged in the housing, each of which is connected to two different openings, and a condenser is arranged below the housing, wherein two openings from different channels are connected for communication by means of a connecting element arranged outside the housing and the connecting element is of rigid design and extends past the side of the condenser.

The circuit elements may be effectively cooled by the two cooling channels. A connection of the cooling channels in the housing may be omitted, thus achieving a particularly compact design of the housing.

The connecting element may transfer a cooling liquid from one channel to another channel. The two channels and the connecting element may form a continuous cooling channel in the housing. By placing the cooling element outside the housing, cooling of the cooling liquid is also possible. The connecting element may have cooling fins or may be made of a heat-conducting material. The shape of the connecting element may be adapted to the structural shape of the inverter housing.

The rigid design has the advantage that no significant pressure drop may occur within the connecting element.

Despite a bulky condenser, the housing may thus remain compact. The cooling of the condenser is less critical compared to the circuit elements, since the semiconductors in the circuit elements are more heat-sensitive than the condenser.

The condenser may be located outside the housing for the circuit elements and may still be connected between the circuit elements via a bus bar. This allows a short connection of the condenser to the circuit elements.

The connecting element may be made of steel, stainless steel, solid plastic or aluminium. A smooth inner tube is also preferred for the connecting element.

In a preferred embodiment of the invention, the two channels in the housing may be in parallel and the connecting element (13) may have at least two angles, in particular in the range of 75 to 115 degrees.

These angles allow the connecting element to be routed around the condenser and enable a compact design of the housing.

A further preferred option is to design one opening as a coolant inlet and another opening as a coolant outlet.

It is also possible that the connecting element has two further angles in the same region, i.e. has a total of four angles. All or individual angles may also be substantially right-angled. This means, in essence, that the angles are right-angled except for manufacturing tolerances.

Preferably, the connecting element may be glued in or to the two openings.

No O-rings are required due to the gluing-in process and an additional fastening of the connecting element to the housing is not necessary. Furthermore, the height of the opening for attachment of the connecting element may be lower compared to the other openings because there is no need to provide space for an O-ring.

The channels of the inverter may be connected to a coolant circuit through the openings. A cooling liquid flows into the two channels through two openings, and the cooling liquid may leave the housing through the two other openings. Cooling liquid may be passed through each of the two channels independently.

In a further embodiment of the invention, the coolant inlet, the coolant outlet, the two channels, the two further openings, the connecting element and a heat exchanger arranged between the coolant outlet and coolant inlet may form a cooling circuit.

The combination of these elements enables the housing to be cooled with only one cooling circuit. The connecting element allows the housing to be built compactly, so that no space is required between the channels inside the housing.

Preferably, the circuit elements may be arranged above the channels. Effective cooling is possible through the channels located below the circuit elements. The housing may be approximately as long as the circuit elements, since, in the housing, a connection between the channels is unnecessary. The existing channel length may therefore be used completely for cooling the circuit elements.

A busbar may be placed further preferably between the two channels. There is space for a busbar between the channels due to the missing connection of the channels.

The circuit elements may be connected to this busbar in the housing. The risk of a short circuit due to cooling liquid is reduced, since the busbar has sufficient distance from the cooling channels.

The circuit elements are cooled by the cooling liquid in the channels. The channels are connected by a connecting element outside the housing. The connecting element is designed so that it is sufficiently spaced from the condenser.

In a further embodiment of the invention, the condenser and the circuit elements may be connected to the bus bar.

The condenser may therefore be used as an intermediate circuit condenser of the inverter without being located in the housing of the inverter. A particularly compact design of the inverter is thus possible.

In accordance with the invention, a vehicle has a housing according to a preferred embodiment.

More preferably, at least two openings may be connected to a vehicle cooling system. The existing vehicle cooling system may serve as a reservoir for the cooling liquid and may also cool this liquid down after said liquid has passed through the housing.

DESCRIPTION OF THE DRAWINGS

FIG. 1 shows the underside of a housing 1. The lower housing shell has four openings 3, 5, 7, 9. In each case two openings 3 and 7, and 5 and 9 are connected on the other side of the housing shell by a channel 10, 11, which is formed by a bulge in the housing 1. A further condenser housing is placed on top of the housing 1, in which condenser housing there is arranged a condenser 19. One of the openings 3 has a flange with a surface into which a recess 17 for a screw may be inserted. By means of this screw connection, a pressure-loaded coolant hose may be attached to the housing.

FIG. 2 shows the inside view of the housing shell. The openings 3, 5, 7, 9 are arranged on opposite sides as compared to FIG. 1. The channels 10, 11 connect the openings and are curved outwards. A cooling liquid may flow through the channels and openings. The openings are located inside the recesses for the channels, and the recesses are surrounded by a sealing means 13, 15. A partition wall may be placed on top of the recesses and, in conjunction with the sealing means, protects the inside of the housing from the liquid in the cooling channel.

Between the channels, there is arranged a busbar 21, 23, 25, 27, 31, which is connected to the different half bridges of the circuit elements. The busbar may be led through the housing wall to the outside.

Figure 1:
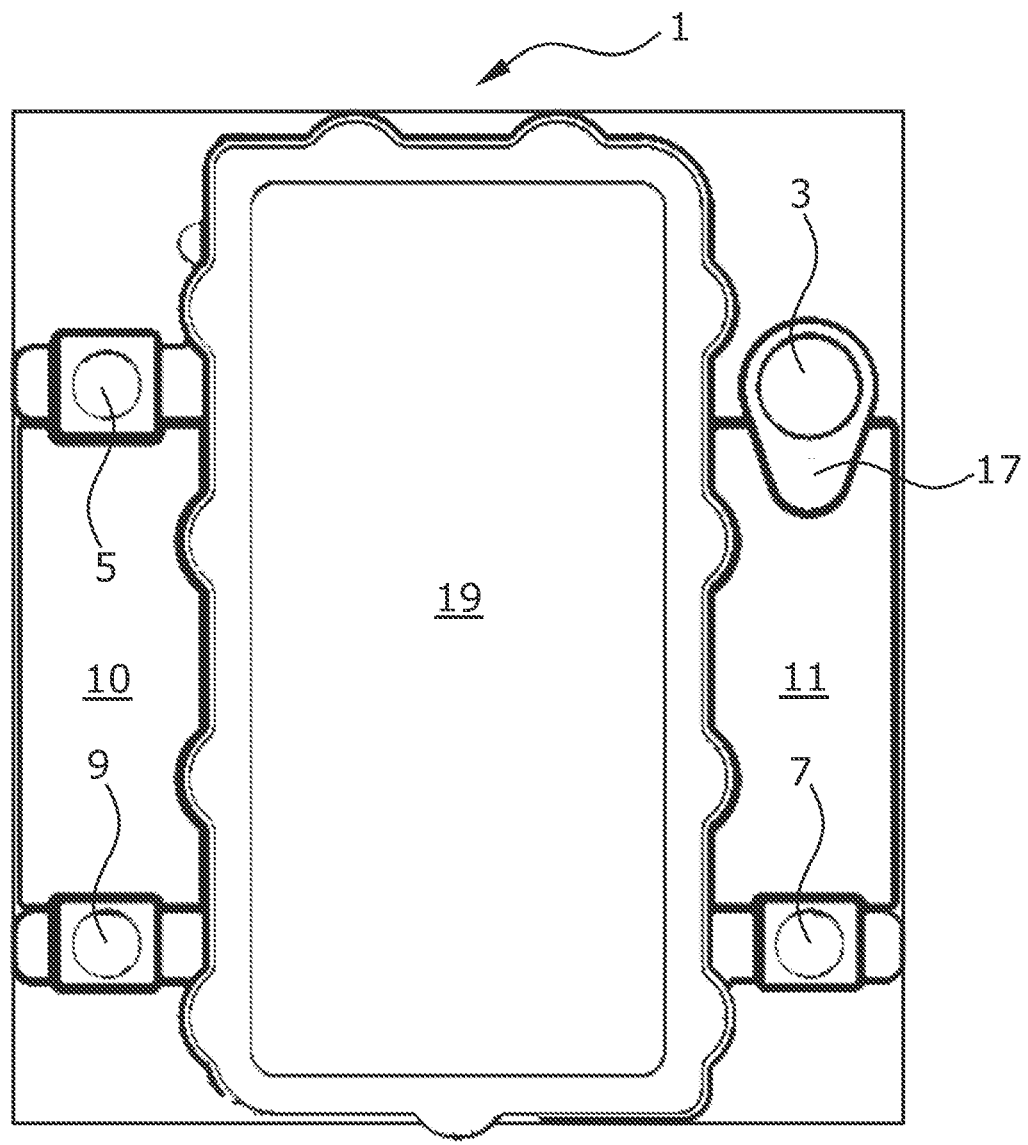
FIG. 1 shows an exterior view of the underside of a housing for an inverter.
Figure 2:
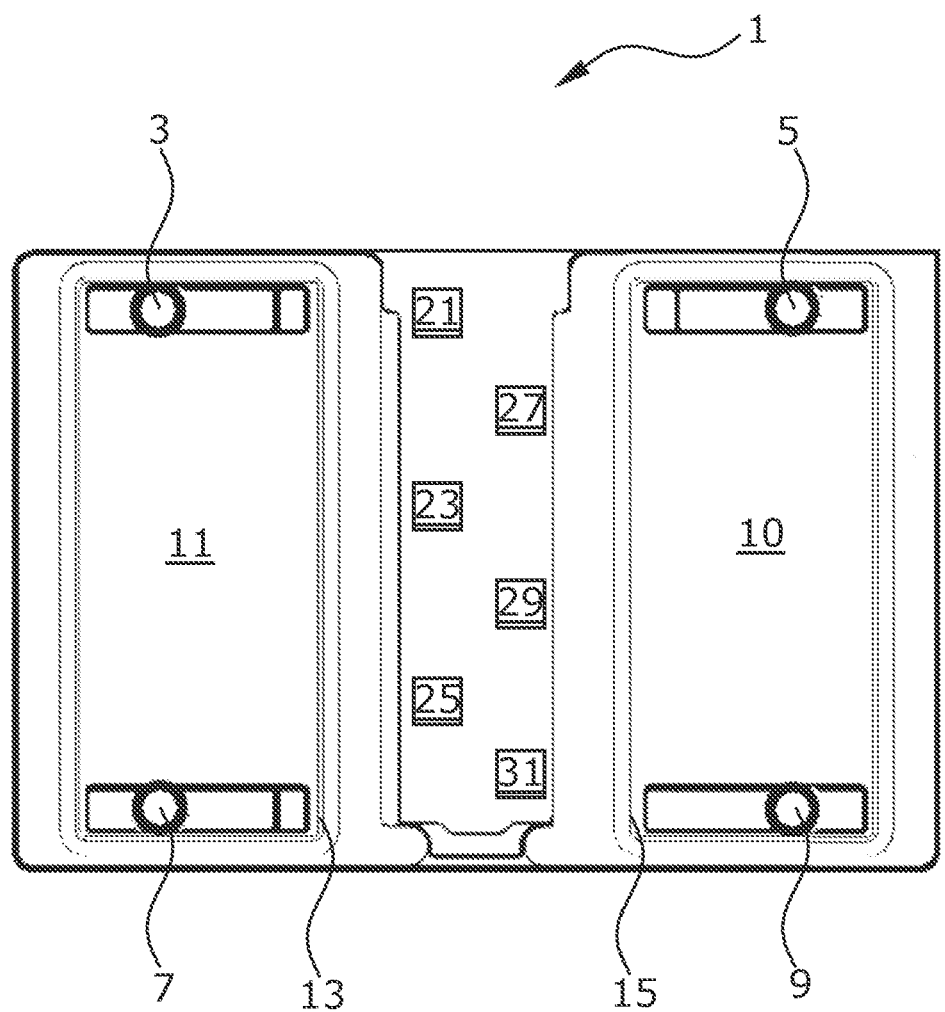
FIG. 2 shows an interior view of the underside of the housing shown in FIG. 1.
Figure 3:
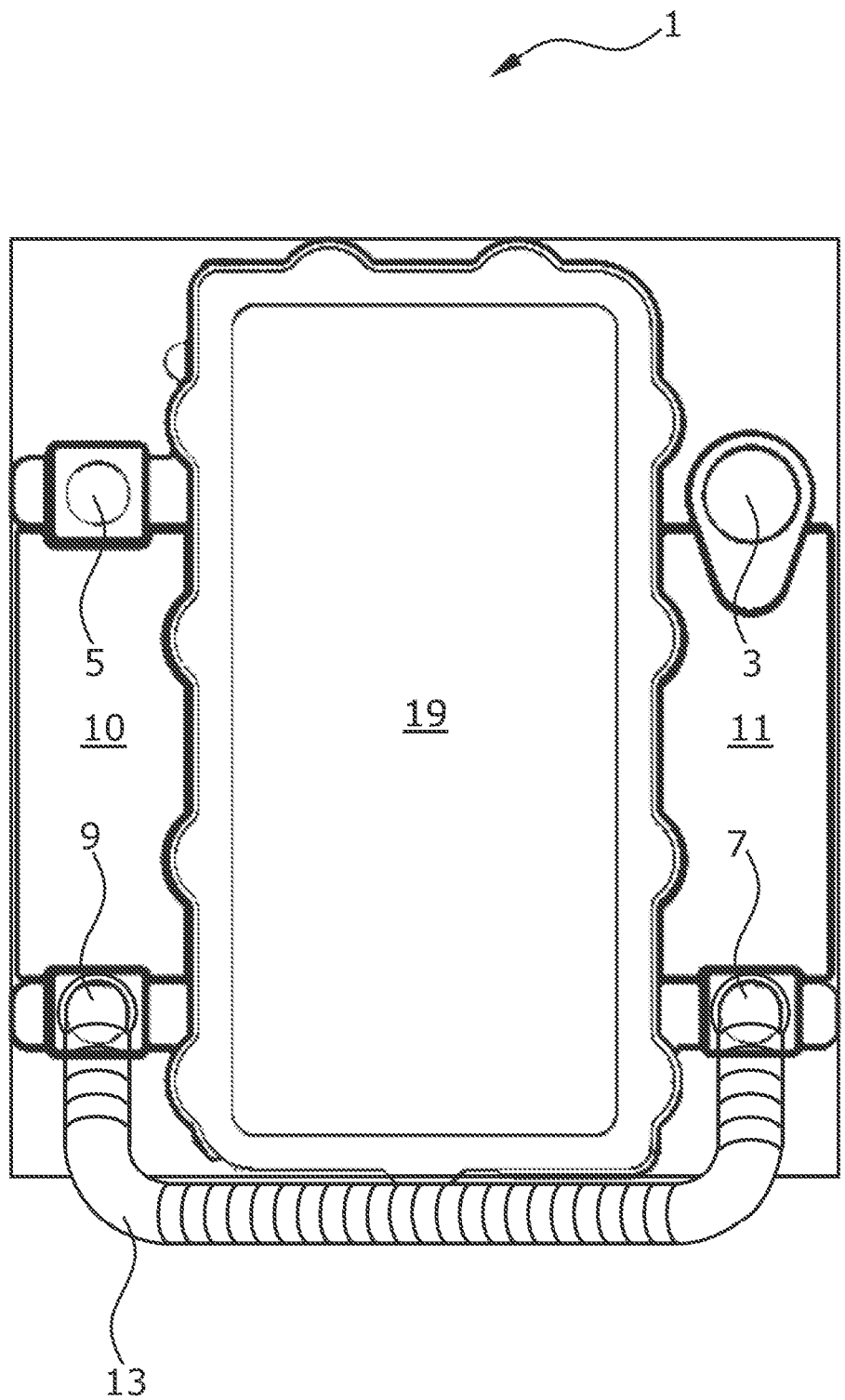
FIG. 3 shows an exterior view of an underside of a housing for an inverter with a connecting element.

FIG. 3 again shows the exterior view of housing 1. Two openings 7, 9 are connected by a connecting element 13. The tube 13 allows the coolant to flow from one channel 10, 11 into the other channel outside the housing 1.

The connecting element 13 is curved in such a way that it has a sufficient distance from the condenser housing with the condenser 19.

Figure 4:
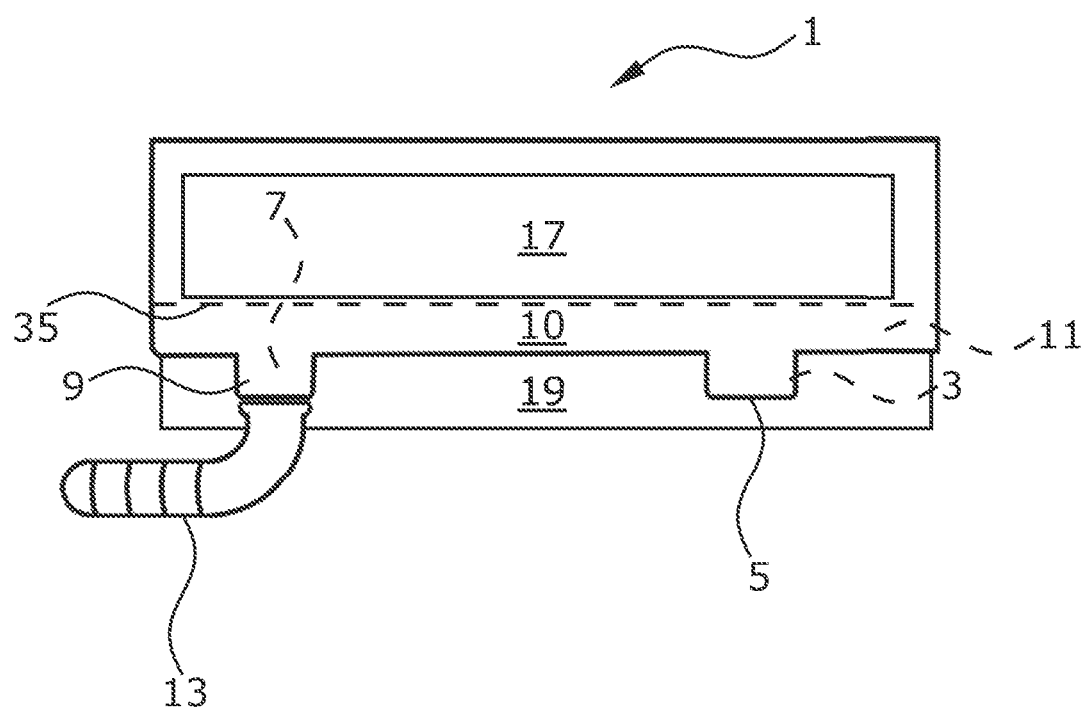
FIG. 4 shows a side view of a housing with a connecting element.

FIG. 4 shows a side view of the housing 1 with a tube as connecting element 13. The openings 3, 7 are located behind the openings 5, 9 and are hidden by them. Inside the housing 1, the channels are formed, which are tightly closed off by a heat-conducting plate 35. Above the plate 35 there are arranged the circuit elements 17, which may transfer heat via the plate 35 to the cooling liquid in the channels 10. Through the connecting element 13, cooling liquid may flow from one channel into the other and the housing 1 only requires a cooling connection of the vehicle via the openings 3, 5 as coolant inlet and outlet.

A condenser 19 is located underneath housing 1 and is connected to the circuit elements located in the housing via a bus bar that leads to the outside.

Figure 5:
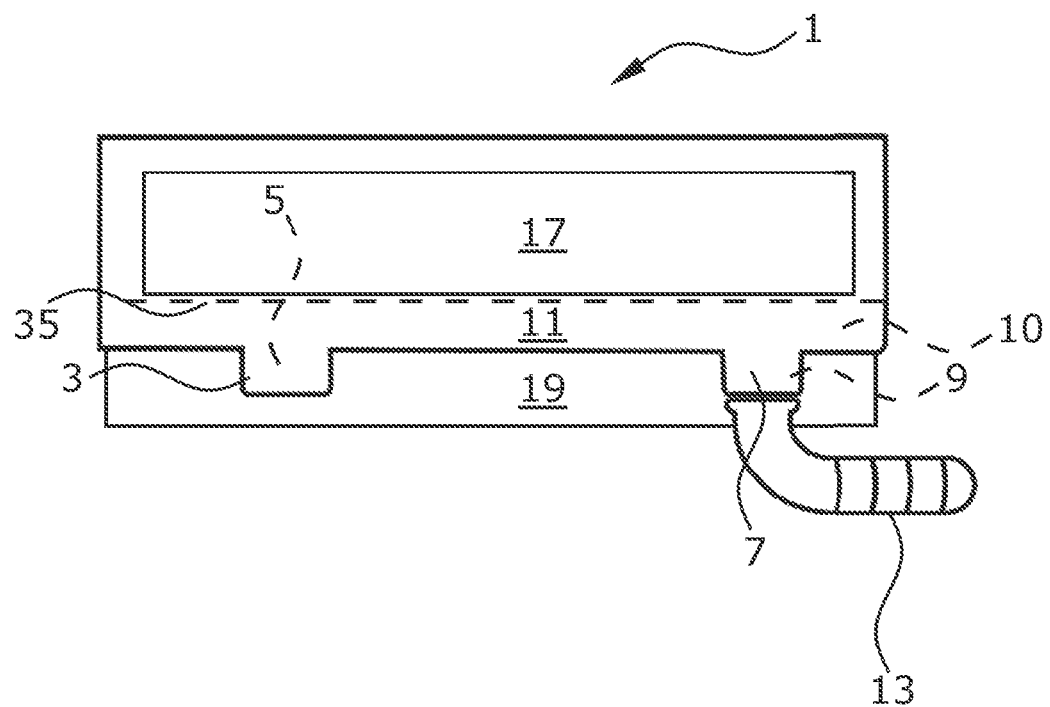
FIG. 5 shows another side view of a housing with a connecting element.

FIG. 5 shows the housing from the opposite side of the housing side shown in FIG. 4.

Figure 6:
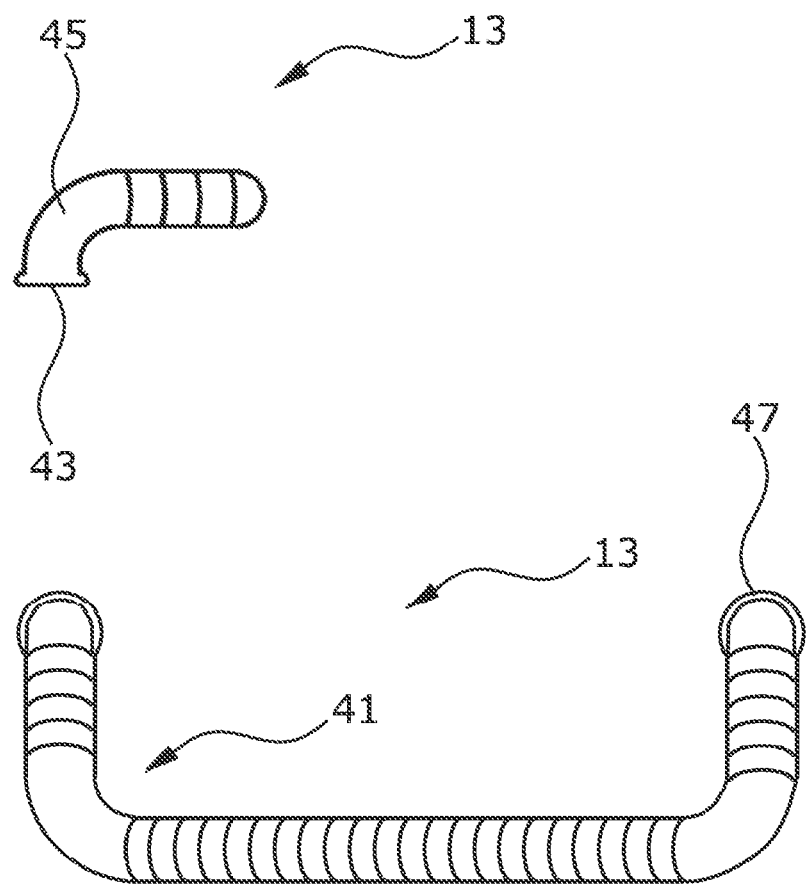
FIG. 6 shows an embodiment of a connecting element in a plan view and side view.

FIG. 6 shows an embodiment of a connecting element 13. The connecting element 13 designed as a tube leads away from the housing 45 and, after some distance from the housing, bends 41 by about 90 degrees towards the other opening. This form, on the one hand, provides sufficient distance to the housing for cooling the tube, but on the other hand takes into account the limited installation space inside a vehicle.

There is a seal at the inlet 43 of the tube. The tube may be screwed to the openings by means of a union sleeve, thus compressing the seal between the opening and the tube.

Figure 7:
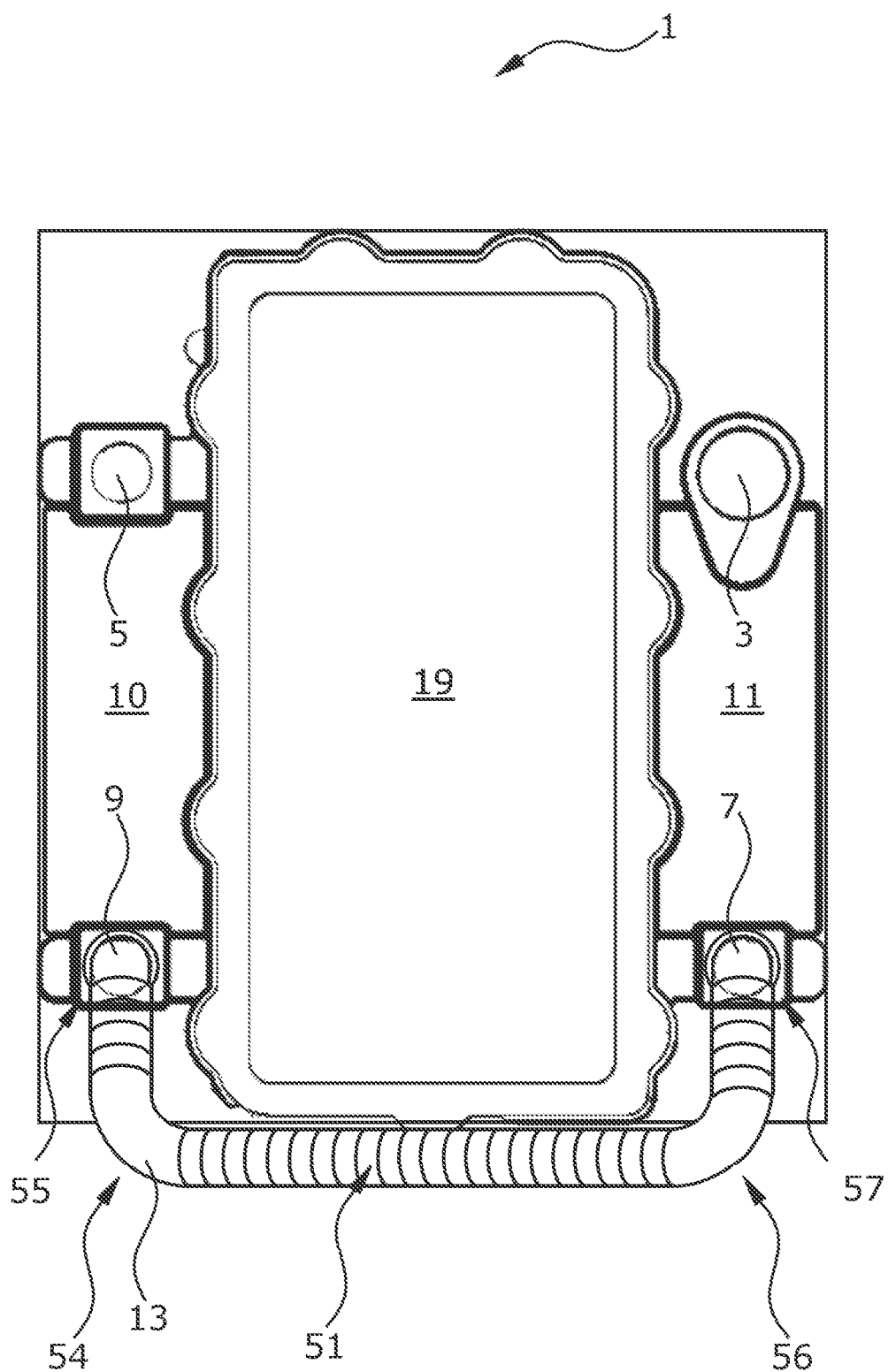
FIG. 7 shows an exterior view of the underside of another embodiment of a housing for an inverter with a connecting element.

FIG. 7 shows the housing 1 with a tube 13 as connecting element. The tube runs from the opening 9 substantially at a right angle and parallel to the condenser 19. At the end of the condenser 19, the tube has another substantially right-angled bend towards the other opening 7 and runs parallel to the condenser 19 towards the other opening 7. After the tube 13 has passed the condenser, the tube 13 again has two right-angled bends 56, 57, which are mirror images of the two previous bends 54, 55. The tube 13 also has cooling fins 51.

Figure 8:
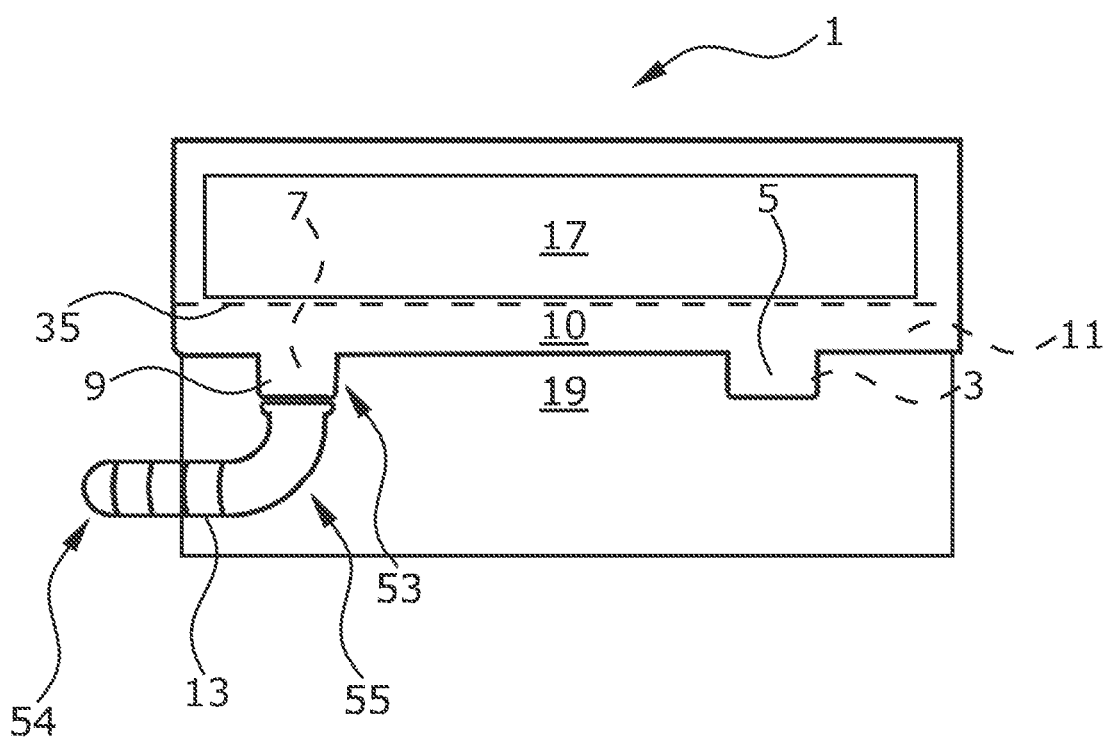
FIG. 8 shows a side view of another embodiment of a housing with a connecting element.

FIG. 8 shows a side view of the housing 1 similar to FIG. 7. The tube 13 has two visible angles 54, 55. The other angles of the tube 13 are hidden by the side view. The tube 13 is glued to or in the opening 9 using adhesive 53.

Figure 9:
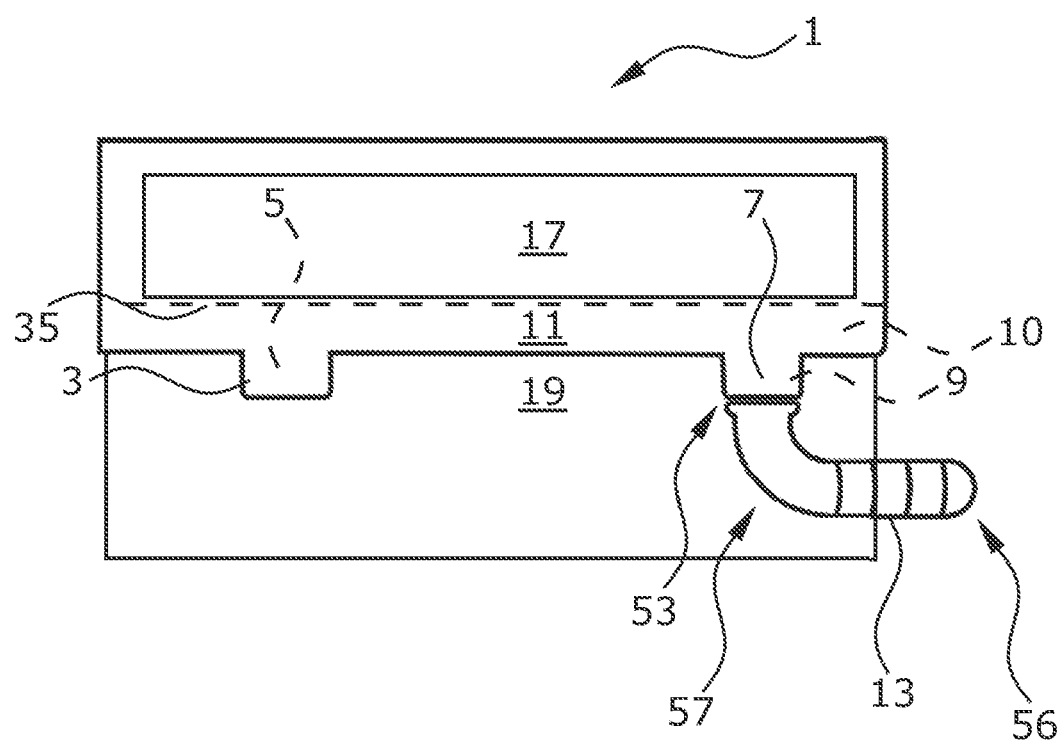
FIG. 9 shows another side view of another embodiment of a housing with a connecting element.

FIG. 9 shows another side view of housing 1 similar to FIG. 7. The tube 13 has two visible angles 56, 57. The other angles of the tube 13, which are shown in FIG. 8, are hidden by the side view. The tube 13 is glued to or in the opening 9 using adhesive 53.

Figure 10:
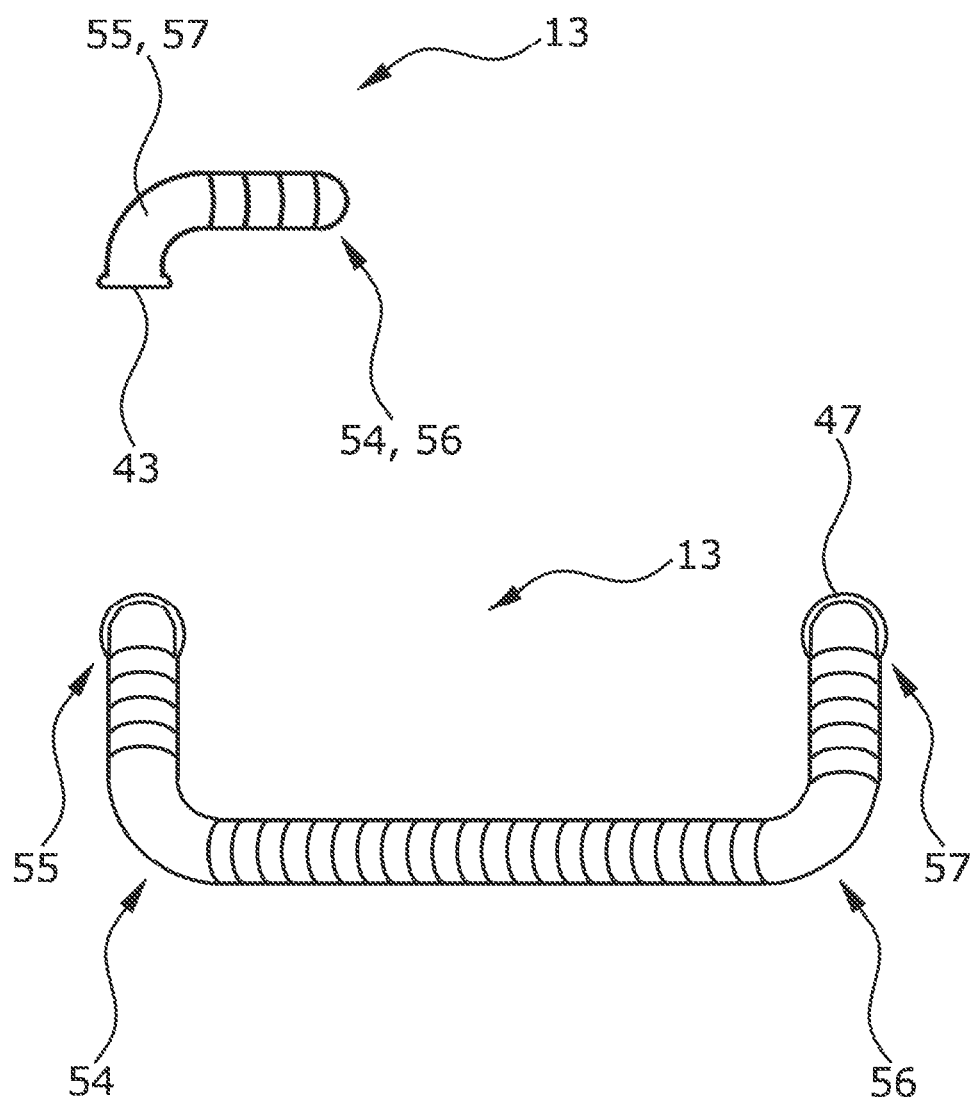
FIG. 10 shows a further embodiment of a connecting element as a plan and side view.

FIG. 10 shows another embodiment of a connecting element 13. The connecting element designed as a tube leads from the housing at an angle of approximately 90 degrees 55 towards the other opening. This form, on the one hand, provides sufficient distance to the housing for cooling the tube, but on the other hand takes into account the limited installation space inside a vehicle.

In addition, the tube 13 has another approximately right angle 54, which guides the tube around the condenser (not shown). Subsequently, the tube has two further angles 56, 57 arranged in a mirror image with respect to the first two.

At the inlet 43 of the tube 13 there is adhesive, which is used to glue the tube 13 to or in the openings, thus creating a tight connection between the opening and the tube.

The invention claimed is:

1. A housing (1) for an inverter comprising circuit elements (17) and a cooling system, wherein the housing has four openings (3, 5, 7, 9) and the cooling system comprises two channels (10, 11) arranged in the housing, each of which is connected to two different openings, and a condenser (19) is arranged below the housing (1), wherein two openings (7, 9) from different channels (10, 11) are connected for communication by means of a connecting element (13) arranged outside the housing and the connecting element (13) is of rigid design and extends past the side of the condenser (19).

2. The housing (1) according to claim 1, wherein the two channels in the housing are parallel and the connecting element (13) has at least two angles, in particular in the range of 75 to 115 degrees.

3. The housing (1) according to claim 1, wherein the connecting element (13) is glued in or to the two openings (7, 9).

4. The housing (1) according to claim 1, wherein one opening is designed as a coolant inlet and another opening is designed as a coolant outlet.

5. The housing (1) according to claim 4, wherein the coolant inlet, the coolant outlet, the two channels, the two further openings, the connecting element and a heat exchanger arranged between the coolant outlet and the coolant inlet form a cooling circuit.

6. The housing (1) according to claim 1, wherein the circuit elements (17) are arranged above the channels (10, 11).

7. The housing (1) according to claim 1, wherein a busbar (21, 23, 25, 27, 29, 31) is arranged between the two channels.

8. The housing (1) according to claim 7, wherein the condenser (19) and the circuit elements (17) are connected to the bus bar.

9. A vehicle comprising a housing (1) according to claim 1.

10. A vehicle comprising a housing (1) according to claim 9, wherein at least two openings are connected to a vehicle cooling system of the vehicle.

* * * * *